US008916779B2

(12) United States Patent
Lin et al.

(10) Patent No.: US 8,916,779 B2
(45) Date of Patent: Dec. 23, 2014

(54) TAPE SUBSTRATE WITH CHIP ON FILM STRUCTURE FOR LIQUID CRYSTAL DISPLAY PANEL

(75) Inventors: Poshen Lin, Shenzhen (CN); Liangchan Liao, Shenzhen (CN); Yu Wu, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 115 days.

(21) Appl. No.: 13/375,471

(22) PCT Filed: Aug. 26, 2011

(86) PCT No.: PCT/CN2011/078960
§ 371 (c)(1),
(2), (4) Date: Nov. 30, 2011

(87) PCT Pub. No.: WO2013/023386
PCT Pub. Date: Feb. 21, 2013

(65) Prior Publication Data
US 2013/0100615 A1 Apr. 25, 2013

(30) Foreign Application Priority Data
Aug. 17, 2011 (CN) .......................... 2011 1 0236390

(51) Int. Cl.
*H05K 1/00* (2006.01)
*H01L 23/00* (2006.01)

(52) U.S. Cl.
CPC ..................................... *H01L 24/50* (2013.01)
USPC ......................................... 174/255; 174/260

(58) Field of Classification Search
CPC ............................... H01L 24/50; H01L 24/86
USPC .................................................. 174/255, 260
See application file for complete search history.

(56) References Cited

U.S. PATENT DOCUMENTS

| 2002/0048156 | A1 | 4/2002 | Saito |
| 2004/0242027 | A1* | 12/2004 | Tanokura et al. ............... 439/60 |
| 2005/0056915 | A1 | 3/2005 | Sumi |
| 2006/0054349 | A1 | 3/2006 | Iguchi |
| 2006/0220242 | A1 | 10/2006 | Kawamura |
| 2010/0182293 | A1 | 7/2010 | Minamino |

FOREIGN PATENT DOCUMENTS

| CN | 1510743 A | 7/2004 |
| CN | 1663037 A1 | 8/2005 |
| CN | 1841686 A | 10/2006 |
| CN | 101682987 A | 3/2010 |
| JP | 2000223795 A | 8/2000 |
| JP | 2003086634 A | 3/2003 |

* cited by examiner

*Primary Examiner* — Jeremy C Norris

(57) ABSTRACT

The present invention provides a tape substrate with COF structures for a liquid crystal display panel. A plurality of package units with the COF structures are arranged along a longitudinal direction of the tape substrate. Each of the package units includes input leads and output leads. In each of the package units, along the longitudinal direction of the tape substrate, the input leads and the output leads are disposed at both sides of the tape substrate, respectively. The present invention further provides the liquid crystal display panel using the tape substrate.

7 Claims, 4 Drawing Sheets

TAPE SUBSTRATE WITH CHIP ON FILM STRUCTURE FOR LIQUID CRYSTAL DISPLAY PANEL

FIELD OF THE INVENTION

The present invention relates to a field of a liquid crystal display technology, and more particularly to a tape substrate with chip on film (COF) structures for a liquid crystal display panel and the liquid crystal display panel comprising the same.

BACKGROUND OF THE INVENTION

In accordance with a development of a liquid crystal display (LCD) technology, a requirement for elements of a liquid crystal display panel is raised gradually.

At present, in a COF type package structure, a driving chip is basically packaged with hot press by tape automated bonding (TAB). The COF type package structure is coiled for transporting. When using the COF type package structure, COF structures can be obtained by cutting a tape substrate, and are electrically connected between a circuit on a glass substrate of an LCD panel and a driving circuit board. At least one COF structure is disposed between the glass substrate and the driving circuit board. The larger a size of the LCD panel is, the more an amount of the required COF structures is.

Referring to FIG. 1, in the COF structure shown in FIG. 1, a longitudinal direction D2 of a driving chip 11 is vertical to a longitudinal direction D1 of a tape substrate 10. The tape substrate 10 has input leads 12 and output leads 13, wherein the input leads 12 are close to a printed circuit board (PCB), and the output leads 13 are close to a glass substrate for outer lead bonding (OLB). The input leads 12 and the output leads 13 are disposed at both sides of the driving chip 11 and arranged radially along the longitudinal direction D1 of the tape substrate 10.

Taking the output leads 13 for example, the output leads 13 are connected to a transparent circuit (not shown) on the glass substrate. The amount of the output leads 13 is more than the input leads 12, and the output leads 13 are arranged very closely. However, in the conventional COF, a width of the tape substrate 10 is less and limited (normally 35 or 48 mm). Thus, the width of each chip (COF) on the tape substrate 10 is also limited. Moreover, with an increase of the amount of the COFs, the leads of each COF are required to be increased. Therefore, obviously, the conventional COF can not meet a high circuit density requirement for the LCD panel of large size.

Accordingly, in the field of the LCD technology, it is a problem that the conventional COF (especially the output leads of the COF) can not meet the high circuit density requirement for the LCD panel of large size.

SUMMARY OF THE INVENTION

An object of the present invention is to provide a tape substrate with COF structures for a liquid crystal display panel, so as to solve a problem that a width of the conventional tape substrate is limited, and the conventional COF (especially the output leads of the COF) can not meet a high circuit density requirement for the LCD panel of large size.

For solving the above-mentioned problems, the present invention provides a tape substrate with COF structures for a liquid crystal display panel. A plurality of package units with the COF structures are arranged along a longitudinal direction of the tape substrate, and each of the package units includes input leads and output leads. In each of the package units, along the longitudinal direction of the tape substrate, the input leads and the output leads are disposed at both sides of the tape substrate, respectively; and along the longitudinal direction of the tape substrate, the input leads of the two adjacent package units are disposed at the same side or different sides of the tape substrate.

Another object of the present invention is to provide a tape substrate with COF structures for a liquid crystal display panel, so as to solve a problem that a width of the conventional tape substrate is limited, and the conventional COF (especially the output leads of the COF) can not meet a high circuit density requirement for the LCD panel of large size.

For solving the above-mentioned problems, the present invention provides a tape substrate with COF structures for a liquid crystal display panel. A plurality of package units with the COF structures are arranged along a longitudinal direction of the tape substrate, and each of the package units includes input leads and output leads. In each of the package units, along the longitudinal direction of the tape substrate, the input leads and the output leads are disposed at both sides of the tape substrate, respectively.

In the tape substrate with COF structures for the liquid crystal display panel, along the longitudinal direction of the tape substrate, the input leads of the two adjacent package units are disposed at the same side of the tape substrate.

In the tape substrate with COF structures for the liquid crystal display panel, along the longitudinal direction of the tape substrate, the input leads of the two adjacent package units are disposed at different sides of the tape substrate.

Still another object of the present invention is to provide a tape substrate with COF structures for a liquid crystal display panel, so as to solve a problem that a width of the conventional tape substrate is limited, and the conventional COF (especially the output leads of the COF) can not meet a high circuit density requirement for the LCD panel of large size.

For solving the above-mentioned problems, the present invention provides a tape substrate with COF structures for a liquid crystal display panel. A plurality of package units with the COF structures are arranged along a longitudinal direction of the tape substrate, and each of the package units includes a driving chip, input leads and output leads. In each of the package units, a longitudinal direction of the driving chip is parallel to the longitudinal direction of the tape substrate, and along the longitudinal direction of the tape substrate, the input leads and the output leads are disposed at both sides of the tape substrate, respectively In the tape substrate with COF structures for the liquid crystal display panel, along the longitudinal direction of the tape substrate, the input leads of the two adjacent package units are disposed at the same side of the tape substrate.

In the tape substrate with COF structures for the liquid crystal display panel, along the longitudinal direction of the tape substrate, the input leads of the two adjacent package units are disposed at different sides of the tape substrate.

Still another object of the present invention is to provide a liquid crystal display panel, so as to solve a problem that a width of the conventional tape substrate is limited, and the conventional COF (especially the output leads of the COF) can not meet a high circuit density requirement for the LCD panel of large size.

For solving the above-mentioned problems, the present invention provides liquid crystal display panel, comprising a first substrate and a second substrate, wherein a transparent circuit on the second substrate is electrically connected to a driving circuit board, and each of the package units includes a driving chip, input leads and output leads. In each of the package units, a longitudinal direction of the driving chip is parallel to the longitudinal direction of the tape substrate, and along the longitudinal direction of the tape substrate, the input leads and the output leads are disposed at both sides of the tape substrate, respectively.

In comparison with the conventional technique, the present invention can solve a problem a width of the conventional tape substrate is limited, and the conventional COF (especially the output leads of the COF) can not meet a high circuit density requirement for the LCD panel of large size.

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

The following embodiments are referring to the accompanying drawings for exemplifying specific implementable embodiments of the present invention.

Figure 1:
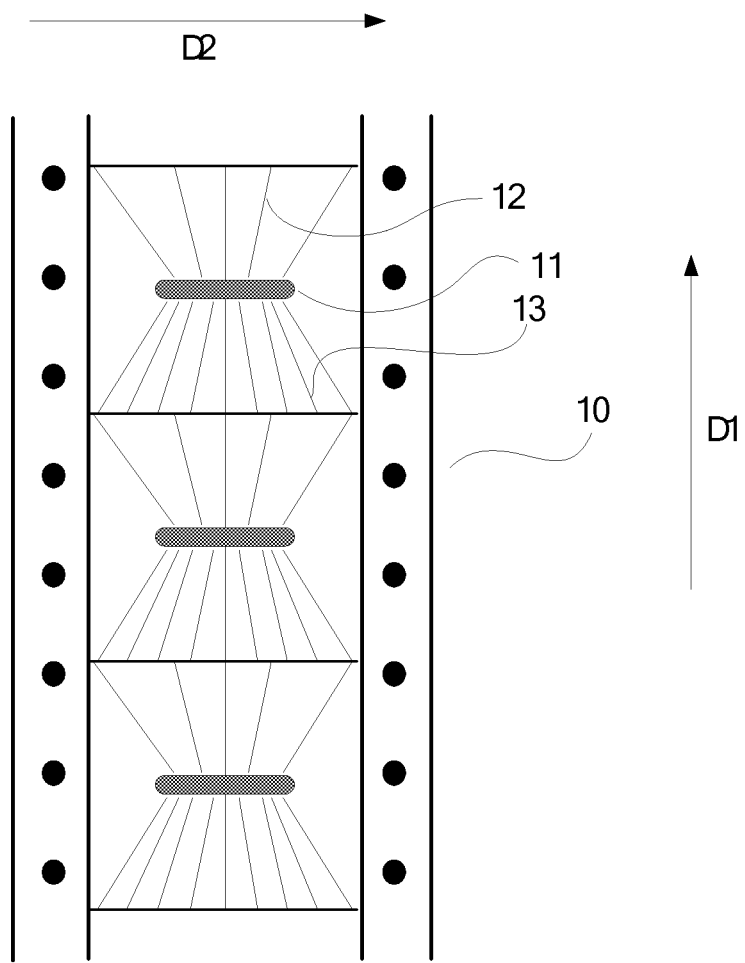
FIG. 1 is a structural diagram showing a conventional COF type package structure.
Figure 2:
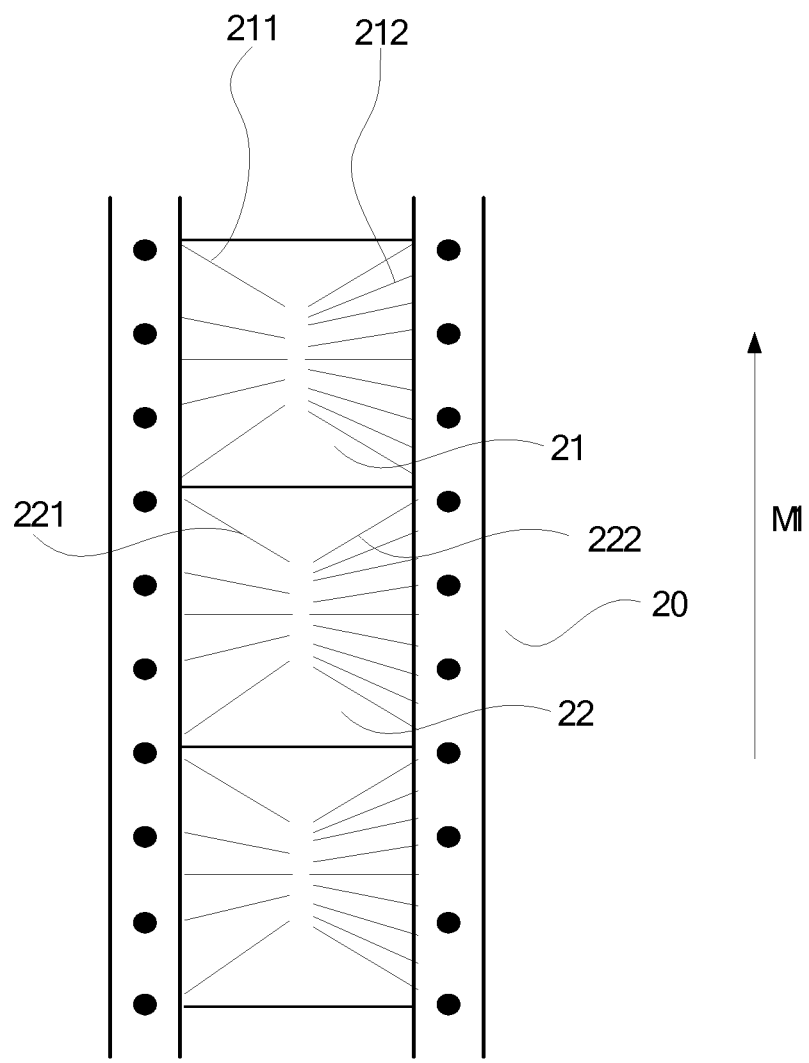
FIG. 2 is a structural diagram showing a tape substrate with COF structures for a liquid crystal display panel according to a first preferred embodiment of the present invention.

Referring to FIG. 2, FIG. 2 is a structural diagram showing a tape substrate with COF structures for a liquid crystal display panel according to a first preferred embodiment of the present invention.

The tape substrate comprises a tape substrate body 20 and a plurality of package units 21, 22 . . . with the COF structures arranged along a longitudinal direction M1 of the tape substrate body 20. Before being cut, the package units are disposed on the tape substrate body 20. In general, the tape substrate body 20 can be regarded as a flexible circuit board which comprises at least two flexible polymer layers and a circuit layer (not shown) disposed there between.

Referring to FIG. 2 again, taking the package unit 21 for example, the package unit 21 includes input leads 211 and output leads 212. In this embodiment, along the longitudinal direction M1 of the tape substrate body 20, the input leads 211 and the output leads 212 are disposed at both sides of the tape substrate body 20, respectively. In this case, the input leads 211 and the output leads 212 are a portion of the circuit layer of the tape substrate body 20.

Referring to FIG. 2 again, the package unit 22 is adjacent to the package unit 21, and includes input leads 221 and output leads 222. In the embodiment shown in FIG. 2, along the longitudinal direction M1 of the tape substrate body 20, the input leads 211 of the package unit 21 and the input leads 221 of the package unit 22 are positioned at the same side of the tape substrate body 20. Certainly, in practice, the input leads 211 of the package unit 21 and the input leads 221 of the package unit 22 can be positioned at different sides of the tape substrate body 20, and the similarities are not mentioned for simplification.

In the embodiment shown in FIG. 2, along the longitudinal direction M1 of the tape substrate body 20, the input leads and the output leads are disposed at both sides of the tape substrate body 20, so as to allow a width of the cut COF to be suitably increased according to a circuit requirement of the LCD panel of large size without being limited by a width of the tape substrate.

Figure 3:
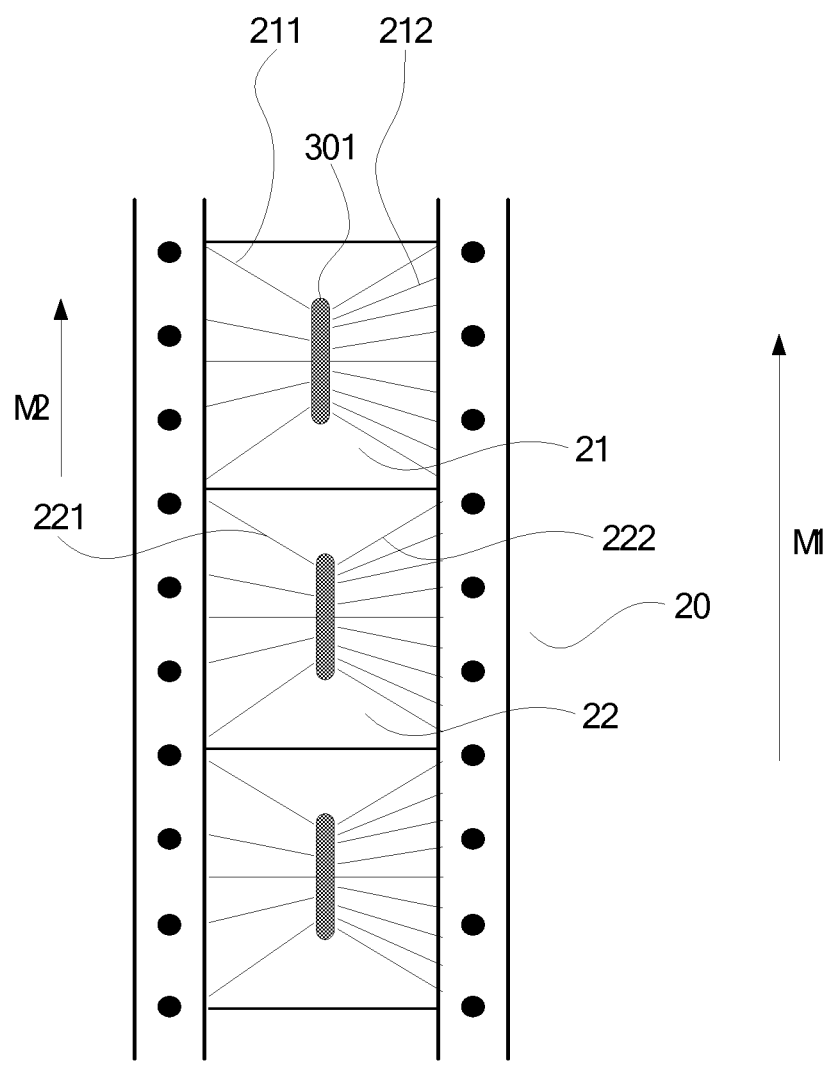
FIG. 3 is a structural diagram showing a tape substrate with COF structures for a liquid crystal display panel according to a second preferred embodiment of the present invention.

Referring to FIG. 3, FIG. 3 is a schematic diagram showing a structure of a tape substrate with COF structures for a liquid crystal display panel according to a second preferred embodiment of the present invention.

The tape substrate comprises a tape substrate body 20 and a plurality of package units 21, 22 . . . with the COF structures arranged along a longitudinal direction M1 of the tape substrate body 20. Before being cut, the package units are disposed on the tape substrate body 20. In general, the tape substrate body 20 can be regarded as a flexible circuit board which comprises at least two flexible polymer layers and a circuit layer (not shown) disposed there between.

Referring to FIG. 3 again, taking the package unit 21 for example, the package unit 21 includes input leads 211 and output leads 212. In this embodiment, along the longitudinal direction M1 of the tape substrate body 20, the input leads 211 and the output leads 212 are disposed at both sides of the tape substrate body 20, respectively. In this case, the input leads 211 and the output leads 212 are a portion of the circuit layer of the tape substrate body 20.

Referring to FIG. 3 again, compared to the embodiment shown in FIG. 2, in the embodiment shown in FIG. 3, the package unit 21 further comprises a driving chip 301. An active surface of the driving chip 301 faces downwardly, and gold bumps (not shown) of the active surface are bonded to inner ends of the input leads 211 and the output leads 212 with hot press.

In the embodiment shown in FIG. 3, the tape substrate body 20 extends along the longitudinal direction M1, and the driving chip 301 extends along a longitudinal direction M2 parallel to the longitudinal direction M1.

Referring to FIG. 3 again, the package unit 22 is adjacent to the package unit 21, and includes input leads 221 and output leads 222. In the embodiment shown in FIG. 3, along the longitudinal direction M1 of the tape substrate body, the input leads 211 of the package unit 21 and the input leads 221 of the package unit 22 are positioned at the same side of the tape substrate body 20. Certainly, in practice, the input leads 211 of the package unit 21 and the input leads 221 of the package unit 22 can be positioned at different sides of the tape substrate body 20, and the similarities are not mentioned for simplification.

In the embodiment shown in FIG. 3, along the longitudinal direction of the tape substrate body, the input leads and the output leads are disposed at both sides of the tape substrate body, so as to allow a width of the cut COF to be suitably increased according to a circuit requirement of the LCD panel of large size without being limited by a width of the tape substrate.

Figure 4:
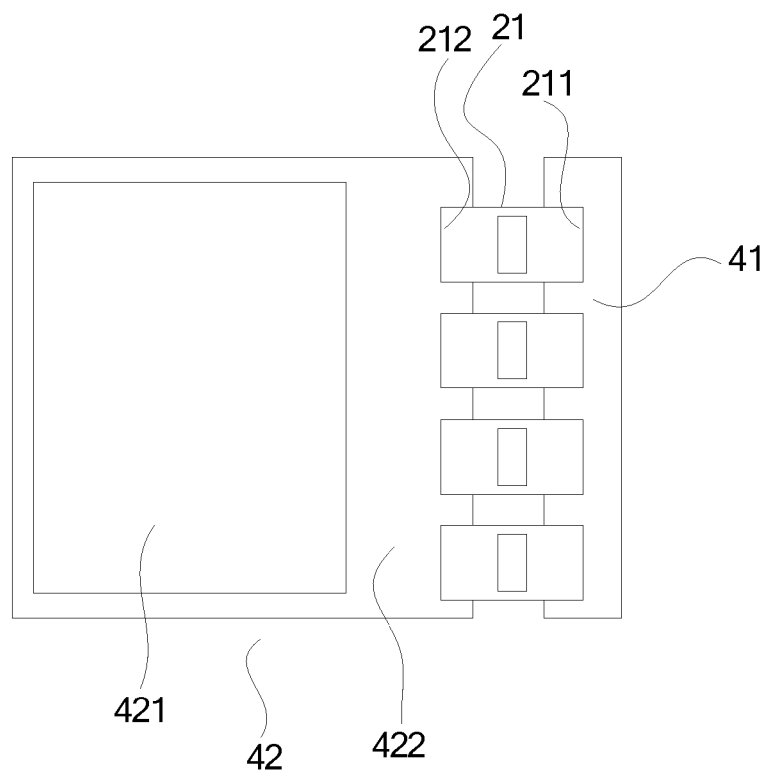
FIG. 4 is a top view showing an assembly of the LCD panel, the COF structures and a driving circuit board according to a preferred embodiment of the present invention.
Figure 5:
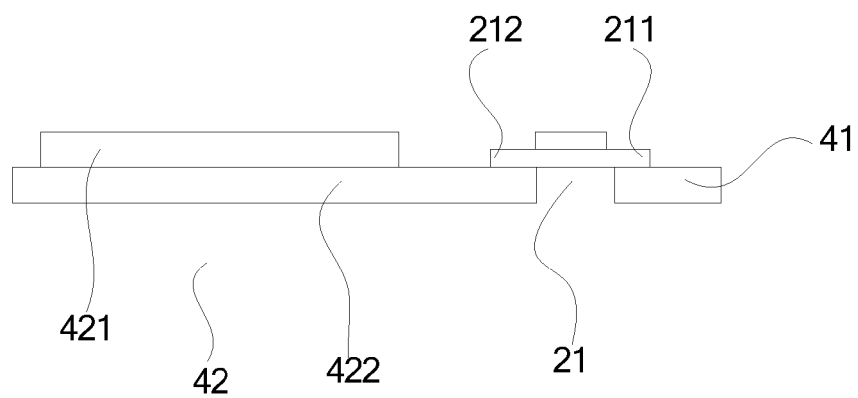
FIG. 5 is a side view showing the assembly of the LCD panel, the COF structures and the driving circuit board according to the preferred embodiment of the present invention.

Referring to FIG. 4 and FIG. 5, FIG. 4 is a top view showing an assembly of the LCD panel, the COF structures and a driving circuit board according to a preferred embodiment of the present invention, and FIG. 5 is a side view showing the assembly of the LCD panel, the COF structures and the driving circuit board according to the preferred embodiment of the present invention.

In the assembly structure shown in FIG. 4 and FIG. 5, the driving circuit board 41 and the LCD panel 42 are illustrated. The LCD panel 42 includes a first substrate 421 and a second substrate 422. A transparent circuit on the second substrate 422 is electrically connected to the driving circuit board 41 by the package units with COF structures. In this case, the package units shown in FIG. 4 and FIG. 5 are obtained by cutting the tape substrate shown in FIG. 3 with COF structures for the liquid crystal display panel.

Taking the package unit 21 for example, the package unit 21 is connected to the driving circuit board 41 by the input leads 211, and connected to the second substrate 422 of the LCD panel 42 by the output leads 212.

In this case, referring to FIG. 3 again, in each of the package units, the longitudinal direction M2 of the driving chip 301 is parallel to the longitudinal direction M1 of the tape substrate body 20. Along the longitudinal direction M1 of the tape substrate body 20, the input leads 211 and the output leads 212 are disposed at both sides of the tape substrate body 20, respectively. Referring to FIG. 4 and FIG. 5 again, the input leads 211 are electrically connected to the driving circuit board 41, and the output leads 212 are electrically connected to the transparent circuit of the second substrate 422.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A tape substrate with chip on film (COF) structures for a liquid crystal display panel, wherein a plurality of package units with the COF structures are arranged along a longitudinal direction of the tape substrate, and each of the package units includes input leads and output leads, characterized in that:

in each of the package units, along the longitudinal direction of the tape substrate, the input leads and the output leads are disposed at both sides of the tape substrate, respectively; and along the longitudinal direction of the tape substrate, the input leads of the two adjacent package units are disposed at the same side or different sides of the tape substrate;

wherein, in each of the package units, the input leads and output leads extend from a region for mounting a driving chip, and a longitudinal direction of the driving chip is parallel to the longitudinal direction of the tape substrate after mounting the driving chip on the region.

2. A tape substrate with COF structures for a liquid crystal display panel, wherein a plurality of package units with the COF structures are arranged along a longitudinal direction of the tape substrate, and each of the package units includes input leads and output leads, characterized in that:

in each of the package units, along the longitudinal direction of the tape substrate, the input leads and the output leads are disposed at both sides of the tape substrate, respectively;

wherein, in each of the package units, the input leads and output leads extend from a region for mounting a driving chip, and a longitudinal direction of the driving chip is parallel to the longitudinal direction of the tape substrate after mounting the driving chip on the region.

3. The tape substrate with COF structures for the liquid crystal display panel according to claim 2, characterized in that: along the longitudinal direction of the tape substrate, the input leads of the two adjacent package units are disposed at the same side of the tape substrate.

4. The tape substrate with COF structures for the liquid crystal display panel according to claim 2, characterized in that: along the longitudinal direction of the tape substrate, the input leads of the two adjacent package units are disposed at different sides of the tape substrate.

5. A tape substrate with COF structures for a liquid crystal display panel, wherein a plurality of package units with the COF structures are arranged along a longitudinal direction of the tape substrate, and each of the package units includes a driving chip, input leads and output leads, characterized in that:

in each of the package units, a longitudinal direction of the driving chip is parallel to the longitudinal direction of the tape substrate, and along the longitudinal direction of the tape substrate, the input leads and the output leads are disposed at both sides of the tape substrate, respectively.

6. The tape substrate with COF structures for the liquid crystal display panel according to claim 5, characterized in that: along the longitudinal direction of the tape substrate, the input leads of the two adjacent package units are disposed at the same side of the tape substrate.

7. The tape substrate with COF structures for the liquid crystal display panel according to claim 5, characterized in that: along the longitudinal direction of the tape substrate, the input leads of the two adjacent package units are disposed at different sides of the tape substrate.

* * * * *